US010175281B2

(12) United States Patent
Genoulaz et al.

(10) Patent No.: US 10,175,281 B2
(45) Date of Patent: Jan. 8, 2019

(54) PROTECTIVE SHEATH FOR AN ELECTRICAL HARNESS IN ORDER TO PREVENT THE DETERIORATION OF SAME

(71) Applicant: Labinal Power Systems, Blagnac (FR)

(72) Inventors: Jerome Genoulaz, Seilh (FR);
Stephane Brendle, Montauban (FR);
Michel Dunand, Balma (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 477 days.

(21) Appl. No.: 14/888,912

(22) PCT Filed: May 7, 2014

(86) PCT No.: PCT/FR2014/051067
§ 371 (c)(1),
(2) Date: Nov. 3, 2015

(87) PCT Pub. No.: WO2014/181065
PCT Pub. Date: Nov. 13, 2014

(65) Prior Publication Data
US 2016/0084898 A1 Mar. 24, 2016

(30) Foreign Application Priority Data
May 7, 2013 (FR) ...................... 13 54161

(51) Int. Cl.
*G01R 31/02* (2006.01)
*H02G 3/04* (2006.01)
*D04C 1/02* (2006.01)

(52) U.S. Cl.
CPC ............. *G01R 31/021* (2013.01); *D04C 1/02* (2013.01); *H02G 3/0481* (2013.01); *D10B 2505/12* (2013.01)

(58) Field of Classification Search
CPC ............................. G01R 31/2827; H02H 3/20
(Continued)

(56) References Cited

U.S. PATENT DOCUMENTS 4,605,894 A * 8/1986 Cox ................. G01R 31/31924
324/537
5,541,516 A * 7/1996 Rider ....................... G01V 3/08
324/326
(Continued)

FOREIGN PATENT DOCUMENTS

GB 1 037 071 7/1966
GB 1 228 164 4/1971

OTHER PUBLICATIONS

Search Report in International Application No. PCT/FR2014/051067 dated Jul. 4, 2014, with English translation coversheet. 3 pages.
(Continued)

*Primary Examiner* — Giovanni Astacio-Oquendo
(74) *Attorney, Agent, or Firm* — Womble Bond Dickinson (US) LLP

(57) ABSTRACT

The invention relates to a device for predicting faults in a harness formed by a plurality of cables gathered together, in particular electrical cables, comprising a protective sheath (10) intended to surround the harness, the sheath (10) comprising a plurality of braided elements (100), said braided elements (100) being braided together to form a tubular sheath, each braided element (100) comprising a plurality of longitudinal braiding strands (101) arranged to form a web, characterised in that the sheath (100) comprises at least one electrically conductive detection strand (102), said detection strand (102) being arranged with the braiding strands (101) of a braided element (100) so as to be incorporated into the web forming said braided element
(Continued)

(100), the detection strand (102) being electrically insulated from the braiding strands (100) of said braided element (100).

11 Claims, 2 Drawing Sheets

(58) Field of Classification Search
USPC .................................. 324/500, 537, 549
See application file for complete search history.

(56) References Cited

U.S. PATENT DOCUMENTS

| 5,635,841 | A | * | 6/1997 | Taylor | F02P 17/00 |
|---|---|---|---|---|---|
| | | | | | 324/380 |
| 6,192,496 | B1 | * | 2/2001 | Lawrence | G01R 31/3191 |
| | | | | | 324/73.1 |
| 6,225,809 | B1 | * | 5/2001 | Watano | G01N 27/60 |
| | | | | | 324/464 |
| 6,265,880 | B1 | | 7/2001 | Born et al. | |
| 2011/0080187 | A1 | * | 4/2011 | Hotz | G01R 31/2889 |
| | | | | | 324/756.02 |

OTHER PUBLICATIONS

Search Report in French Application No. 1354161 dated Oct. 31, 2013, with English translation coversheet. 7 pages.

\* cited by examiner

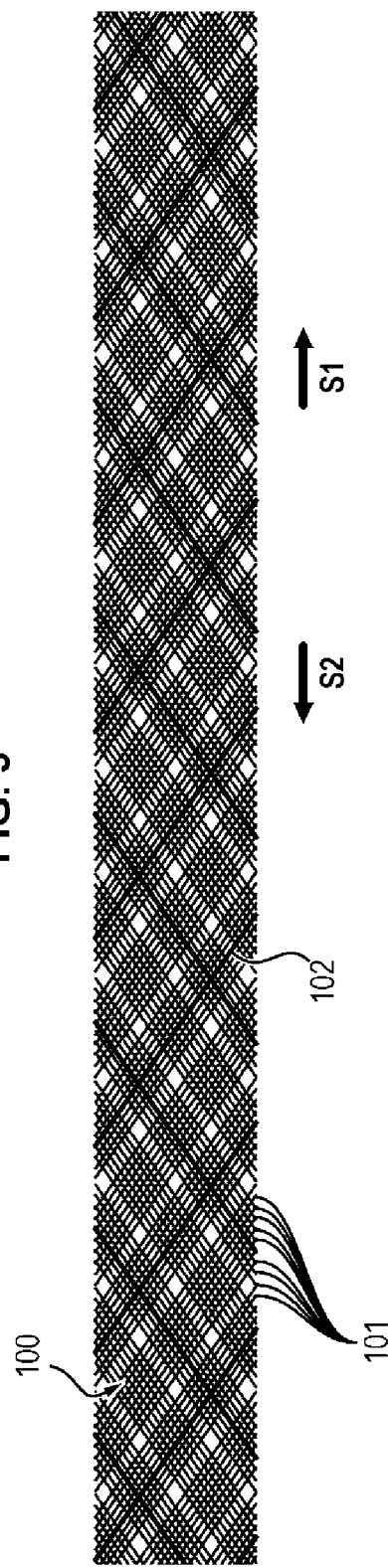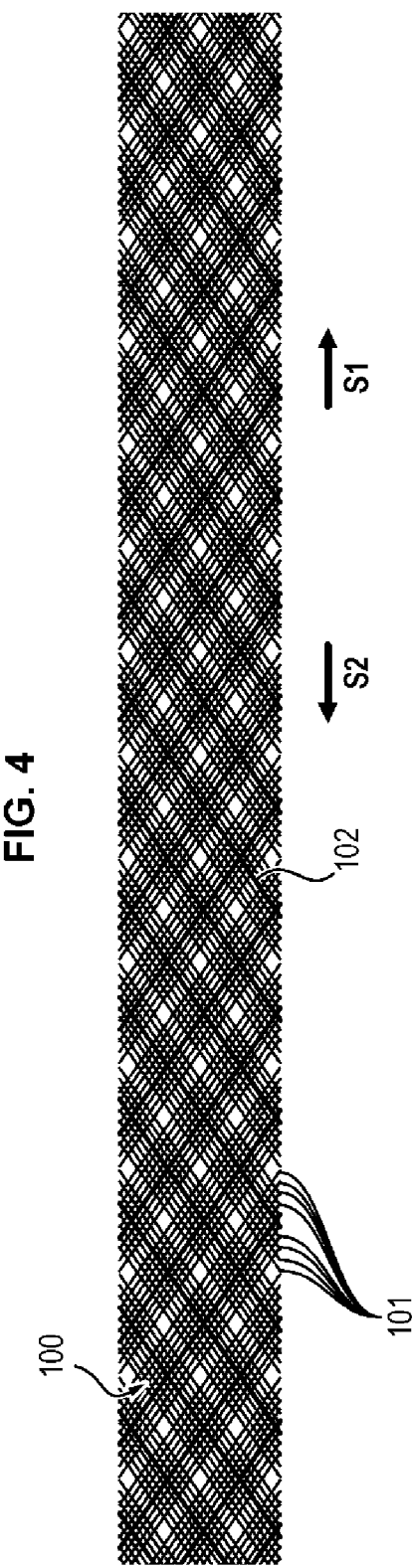

PROTECTIVE SHEATH FOR AN ELECTRICAL HARNESS IN ORDER TO PREVENT THE DETERIORATION OF SAME

FIELD OF THE INVENTION

The present invention relates to the prevention of deterioration of cables, especially electrical cables, and more particularly a monitoring device and method for detecting possible deterioration of the cables.

PRIOR ART

Today there are still many applications and installations which need the use of cables, in particular electrical cables, to ensure their operation. These cables are subject to more or less considerable stresses which, when added to natural wear, can deteriorate them to where they cause malfunctions, or even prevent them from operating.

In some specific applications, such as for example automobiles, aeronautics, naval operations, several electrical cables are generally combined in bundles to form harnesses. A harness therefore combines a set of electrical conductors intended to electrically join together the various equipment of a complex electrical installation, proper operation of which must be ensured.

In general, this set of cables forming the harness is enclosed by a protective sheath. Apart from the fact of keeping the cables together, these sheathes can offer mechanical protection, fire protection and/or electromagnetic protection. In the case of electromagnetic protection, such as for example on board aircraft or on board ships, it is essential that the electrical installation interconnected by the electrical harness functions correctly even in case of electromagnetic perturbations, such as lightning strike. Even if each electrical conductor in general comprises its own insulating sheath which can also comprise extra protective shielding against electromagnetic perturbations, it is preferable that the harness itself comprises a protective sheath against electromagnetic perturbations. This sheath is needed in particular when the harness is too close to another sensitive harness, or when the aim is to ensure lightning or strong field protection. In this way, the set of electrical cables forming the harness can for example be enclosed by a sheath of metallic shielding, generally obtained by braiding of metallic wires, which ensures electrical continuity between the equipment housings via the connection of the shielding to the connectors located at the ends of the harness.

Yet despite these sheathes, the harness can undergo different attacks according to the environment in which they are placed. Deterioration of electrical cables forming the harness can for example be due to mechanical stresses, such as crushing, clamping, elongation, shock or any wear by friction. Deterioration can also be due to external phenomena such as attacks by fluids, chemical attacks or by fire.

Such stresses or attacks can cause degradation of the insulators and/or cores of the electrical conductors contained in the harness, with more or less considerable consequences for general operation of the electrical installation. Apart from minor deteriorations creating faults in the conductor leading to malfunctions, these degradations can engender much more serious faults with major associated consequences.

For example, over time such faults can create an open circuit engendering an electrical arc if the circuit is in a functional phase and according to the connected system, when the circuit is opened, then in all cases a loss of data or a loss of equipment power according to which the relevant cable is a data cable or a power cable. A major fault can also cause an indirect short-circuit between two or more systems or between two or more conductors of the same system and can cause an electrical arc.

In the case of an open circuit, the connected system is faulty. Often it is initially the equipment which is at fault and replaced. If the equipment still fails to work, the fault lies with the cable. System downtime can be time-consuming and very costly.

In the case of a short-circuit, the energy of the resulting arc can be substantial, especially in the case of a power cable. Adjacent cables and nearby structures can be damaged in turn. It is necessary not only to change the cable on which the first fault occurred but also those which have undergone degradation due to the rise in temperature (hot plasma), electromagnetic radiation (UV to infrared), material projection (liquefied materials subject to LAPLACE forces) created during evolution of the electrical arc. Adjacent structures can also undergo serious degradation needing replacement or repairs.

To reduce the risk of appearance of such consequences, it has for example been proposed to use circuit breakers with arc detection provided to cut the power line when the conductor short-circuits and produces an arc. Their use does pose a certain number of problems. In effect they just partly protect adjacent cables and structures because the arc is detected only from the instant when it occurs, and the fault cannot be anticipated and in this case can no longer prevent degradation of structures and adjacent cables. Also, circuit breakers detect short-circuits but not open circuits as they are not associated with discharge. If friction on an adjacent structure causes rupturing of a conductor then this fault will not be detected by the circuit breaker. Finally, if a circuit breaker can be installed on a power cable, it cannot be employed for data cables.

It is therefore important to be able to anticipate the appearance of faults on those cables forming the harness to prevent any major malfunction. Also, such anticipation of the appearance of faults on cables could considerably reduce the cost of maintenance and ensure a greater rate of availability. In fact maintenance of the protective/detection device is simpler to manage than changing one or more conductors.

U.S. Pat. No. 6,265,880 proposes a solution for anticipating the appearance of faults in an electrical cable. This solution consists of winding around the conductor a detection element (such as for example a conductive wire or a fiber optic cable) positioned on the conductor so as to be damaged before the conductor, by friction for example, and detecting potential deterioration coming from the conductor. This solution however poses several problems. In fact, apart from the detection element as such, it is necessary to provide a holding element in the position of this detection element so that it cannot move relative to the conductor, especially in case of excessive vibrations. In the way, the weight of the cable to be monitored is substantially increased and this can be a major disadvantage. Also, such a holding element does not guarantee that the detection element will absolutely not move. Now, if the detection element were to shift relative to the conductor, some portions of the conductor would no longer be monitored, detracting from the efficacy of the solution. Since the element is more or less supple it can be pushed back by the action causing the fault, such as for example friction or the action of a peak and accordingly cease to ensure protection at the preferred site. Finally, such a solution is fairly complex to carry out, requiring specific means for placing of the detection element around the cable, and for placing a holding element in an adapted position. This solution in particular will be very difficult to carry out to prevent the appearance of faults in a harness comprising several cables joined together. In fact, applying the solution proposed in patent U.S. Pat. No. 6,265,880 in the case of multi-wire harnesses would be tantamount to having to individually enclose each electrical conductor forming the harness in a specific detection element. The consequences in terms of payload and costs, especially manufacturing, are unacceptable.

An aim of the present invention is therefore to propose a device and a prediction method of faults in a harness formed by a plurality of cables joined together, in particular electrical cables, which resolve at least one of the above disadvantages.

In particular, an aim of the present invention is to propose a device and a prediction method of faults in a harness which is simple to carry out, in particular whereof the positioning relative to the harness does not make manufacturing of said harness complex.

Yet another aim of the present invention is to propose a device and a prediction method of faults in a harness which does not modify, or only slightly, the intrinsic characteristics of the harness and in particular does not impair its operation, or add to its weight.

EXPLANATION OF THE INVENTION

For this purpose, a prediction device of faults in a harness formed by a plurality of cables joined together is proposed, in particular electrical cables, comprising a protective sheath intended to enclose the harness, the sheath comprising a plurality of braiding elements, said braiding elements being braided together to form a tubular sheath, each braiding element comprising a plurality of longitudinal braiding strands arranged to form a web, characterized in that the sheath comprises at least one detection strand, said detection strand being arranged with the braiding strands of a braiding element to be integrated into the web forming said braiding element, the detection strand being electrically insulated from the braiding strands of said braiding element.

Preferred but non-limiting aspects of this protective sheath, taken singly or in combination, are the following:
  the sheath comprises a plurality of detection strands, the detection strands being electrically insulated from each other.
  the detection strands are integrated in different braiding elements forming the sheath.
  the sheath comprises as many detection strands as braiding elements.
  several detection strands of the plurality of detection strands are integrated into braiding elements braided in a first direction of rotation, and the other detection strands of the plurality of detection strands are integrated into braiding elements braided in a second direction of rotation opposite the first direction of rotation.
  all the detection strands of the plurality of the detection strands are integrated into braiding elements of the braided sheath in the same direction of rotation.
  each detection strand is an electrically conductive wire enclosed by an electrically insulating tubular element.
  the braiding strands of the braiding elements of the sheath are electrically conductive wires, the different braiding elements being braided to form a protective electromagnetic sheath of the cables.
  the braiding strands of the braiding elements of the sheath are textile yarns, the different braiding elements being braided to form a mechanical protective sheath of the cables.

According to another aspect, a manufacturing method of the prediction device hereinabove is proposed, characterized in that it comprises a coiling step during which at least one detection strand is arranged with a plurality of braiding strands to form a braiding web which is coiled, said braiding web being then uncoiled during a braiding step to form the protective sheath around a harness formed by a plurality of cables joined together.

According to yet another aspect, a prediction method of the deterioration of cables is proposed, in particular of electrical cables, combined to form a harness and enclosed by the prediction device hereinabove, comprising application of electric current in the at least one detection strand of the protective sheath, and monitoring of the electrical performance of said detection strand.

DESCRIPTION OF FIGURES

Other characteristics and advantages of the invention will emerge from the following description which is purely illustrative and non-limiting and must be viewed in conjunction with the appended drawings, in which:

FIG. 3 is an illustration of a braiding pattern for the protective sheath according to a second embodiment of the invention;

FIG. 4 is an illustration of a braiding pattern for the protective sheath according to a third embodiment of the invention.

DETAILED DESCRIPTION OF THE INVENTION

As indicated above, a harness comprises a set of cables, especially a set of electrical cables, which are single or combined in subsets of cables, called stranded wires.

A harness is preferably generally enclosed by a protective sheath, and can have a mechanical protective function, and/or a fire protection function, and/or an electromagnetic protection function for example.

The solution proposed to anticipate the appearance of a fault in the harness consists of integrating a detection system of faults right inside the protective sheath. So, when the sheath is stressed to the point of triggering the detection system integrated therein, it is clearly necessary to act to avoid the detected stress from damaging the cables forming the harness.

The advantage of integrating the detection system within the protective sheath is to offer a prediction device of faults which does not substantially modify the harness and its protective sheath, especially in terms of weight or operation. Also, this imposes no particular modification in the use of the harness enclosed by its sheath, or in its conception.

Figure 1:
FIG. 1 is an illustration of a protective sheath intended to enclose a harness and forming the prediction device according to the invention.

As is shown in FIG. 1, protective sheathes 10 used to enclose the harness are generally formed by a plurality of braiding elements 100, also called spindles, which are braided together to form a tubular sheath, surrounding the harness intended to be protected.

Each braiding element 100 comprises several braiding strands 101 which are arranged beside each other, connected to form a web.

These braiding strands 101 are generally all the same type, identical to each other, selected as a function of the required purpose for the protective sheath.

For example, if the protective sheath has a mechanical or fire protection function, or even mechanical reinforcement, the braiding strands 101 can be so-called textile wires, mono- or multifilaments of polymers, wires made of mineral material (ceramic, amorphous glass or not), or metallic wires such as stainless steel wires.

When electromagnetic protection is preferred, the braiding elements 100 are preferably formed by braiding strands in the form of electrically conductive wires which are arranged and braided to offer this protective electromagnetic function. Such conductive wires can for example be metallic wires, such as nickeled copper wires, silvered copper wires, enamelled copper wires, stainless steel wires. These conductive wires are arranged in webs to form the different spindles 100, these spindles being braided so as to ensure electrical continuity between the cables located at the ends of the harnesses protected by the sheathes.

To enable prediction of the appearance of faults in the cables forming the harness, the protective sheath comprises at least one detection strand 102 which is electrically conductive, and which has the particular feature of being arranged with the braiding strands 101 of at least one of the spindles 100 of the sheath 10, so as to be fully integrated into the web forming this spindle 100.

Monitoring the state of operation of the detection strand 102 verifies that the sheath is not subject to excessive stresses which might impact on the cables of the harness and encourage the appearance of faults.

In fact, when stress is applied to the sheath 10, friction for example, and when this stress damages the detection wire 102 of the sheath 10, detection of this damage deduces that the cables of the harness also risk being damaged if the stress endures, and that action therefore has to be taken.

Monitoring the state of electrical conductivity of the detection strand 102 can for example serve as basis for detection of damage to said detection strand 102. To enable prediction and detection via the detection strand, the detection strand 102 is preferably electrically insulated from the braiding strands 101 of the relevant spindle 100. More preferably, the detection strand 102 is also insulated from the other braiding strands 101 of the other spindles 100 of the web 10.

The detection strand 102 can for example be an electrically conductive wire enclosed by an electrically insulating tubular element, such as an enamelled metallic wire, for instance an enamelled copper wire. This ensures insulation of the detection strand 102 relative to the braiding strands 101, or even relative to the other detection strands provided in the sheath, as will be evident later.

The detection strand 102 can also simply consist of an electrically conductive wire, without complementary insulator, but the insulation of which relative to the other braiding strands is effective, for example because these braiding strands are textile yarns, and/or via a specific arrangement of the detection strands in the braided spindles.

The detection strand 102 can also be a coaxial cable, which improves detection of faults, with more precise detection of the location of such faults, especially in the case of use of measurements of reflectometry, as specified hereinbelow.

Detecting damage to the detection strand 102 can for example consist of having a current pass through this detection strand 102, and monitoring its electrical performance.

Such monitoring of the electrical performance of the detection strand 102 can be conducted using methods known to those skilled in the art, such as for example measurements of impedance, measurements of capacity, cutting tests, or other. For detection by measurement of impedance, the detection strands 102 at one end of the harness can for example be short-circuited and the impedance measurement device can be connected at the other end of the measurement strands.

Another preferred process for monitoring the electrical performance of the detection strand 102 comprises taking reflectometry measurements. Time reflectometry TDR (for «Time Domain Reflectometry») or frequential reflectometry FDR (for «Frequency Domain Reflectometry») could for example be used.

The use of monitoring processes by reflectometry is highly advantageous since it not only detects that the detection strand 102 is damaged, but also locates the position where said detection strand 102 is damaged. It can therefore be deduced where the harness could be damaged if the stress were to be maintained, and therefore take action more precisely on the harness. This is particularly advantageous when the harness is placed where access is difficult.

Another advantage of the use of monitoring processes by reflectometry is that they can be used without perturbing the electromagnetic performance of the harness, and without influence of electromagnetic protection. Some reflectometry processes enable control of the level of voltage, spreading of the spectrum, or other parameters which make them usable in high-stress conditions, especially for vehicles in use, such as for examples aircraft or ships where the electromagnetic stresses are substantial.

According to a preferred embodiment the sheath comprises a plurality of detection strands 102, the detection strands being electrically insulated from each other. The fact of multiplying the detection strands 102 in the sheath 10 allows damage detection areas on the sheath 10 which are more numerous and therefore offers greater probability of prediction of appearance of faults on the harness. However the number of detection wires 102 integrated into the braiding webs should not modify or only slightly modify the protective performance of the sheath 10, or add to the weight of this sheath 10. Also, adding at least two detection strands, arranged in parallel or twisted, carries out monitoring via differential detection.

The different detection strands 102 are preferably integrated into different braiding elements 100. This in fact more evenly and uniformly distributes the detection areas over the sheath 10.

For example, a sheath 10 which comprises as many detection strands 102 as braiding elements 100 can be provided, which offers increased detection. According to this example, each braiding element 100 integrates a detection strand 102 among the braiding strands 101 forming the web to be braided.

In the event where the sheath 10 comprises a number of detection strands 102 greater than the number of braiding elements 100, there will be some braiding elements integrating several detection strands 102. This configuration allows increased detection but cannot be considered only in cases where the protective operation of the sheath 10 is not impacted by this integration of a large number of detection strands 102.

When the sheath 10 comprises several detection strands 102, it is preferable for these detection strands 102 to be positioned so as not to unbalance the general equilibrium of the tubular sheath.

Therefore, detection strands 102 are preferably integrated by distribution, both in spindles 100 intended to be braided in a direction of rotation relative to the braiding direction (for example to the right) and in spindles 100 intended to be braided in an opposite direction of rotation relative to the braiding direction (for example to the left).

More preferably, the detection strands 102 are integrated into spindles 100 intended to be braided substantially symmetrically in the protective sheath 10. This contributes to the proper balance of the sheath 10 relative to the harness.

It could also be considered that all the detection strands 102 are integrated into braiding elements of the braided sheath in the same direction of rotation. This is for example feasible in the case of a sheath braided in fabric, that is, formed by spindles 100 with textile yarns, in which detection strands 102 being electrically conductive wires without insulation sheath are integrated. Since the detection strands 102 are integrated into spindles all being braided in the same direction of rotation, the detection strands 102 do not come into contact with each other, and fault detection can be run. This also uses detection strands of reduced weight, avoiding a heavier protective sheath.

The number of detection strands 102 to be used and their arrangement in the protective sheath are adapted as a function especially of conditions of use of the sheath, and of the level of performance required for the sheath.

For example, when a protective electromagnetic sheath is made, that is, electromagnetic shielding, its transfer impedance is defined as a function of electromagnetic stresses. This transfer impedance is governed by different parameters such as the diameter of the harness to be protected, the braiding angle of the spindles 100 of the sheath 10, the number of spindles 100, the number of braiding strands 101 per spindle 100, the diameter of braiding strands 101 and the material of the braiding strands. As the diameter of the harness is imposed by the cables contained in said harness, the other parameters are selected to obtain the preferred transfer impedance. This produces a specific braided sheath in which a certain number of braiding strands 101 can be replaced or added by detection strands 102.

In general, a protective electromagnetic braided sheath has a real performance higher than the template not to be exceeded for the harness. Because of this it is possible to profit from this margin between the real performance of the braid and the template for replacing some braiding strands by detection strands, which would slightly degrade the performance of the braided sheath without as such its becoming inferior to the performance required by the template. On the contrary, adding the detection strand(s) will be enough. This requires controlling the prediction of the performance of the braid to guarantee the respect of the template imposed for the main function of the protective sheath, and adding a monitoring function.

The braided sheath can also be dimensioned by taking into account not only its protective performance, electromagnetic for example, but also by considering damage prediction performance. For example, it could be worth forming the braided sheath by including that the damageable surface of the harness must not be greater than 1 $cm^2$, and therefore in this case by having a portion of detection strand at least every 1 $cm^2$.

Figure 2:
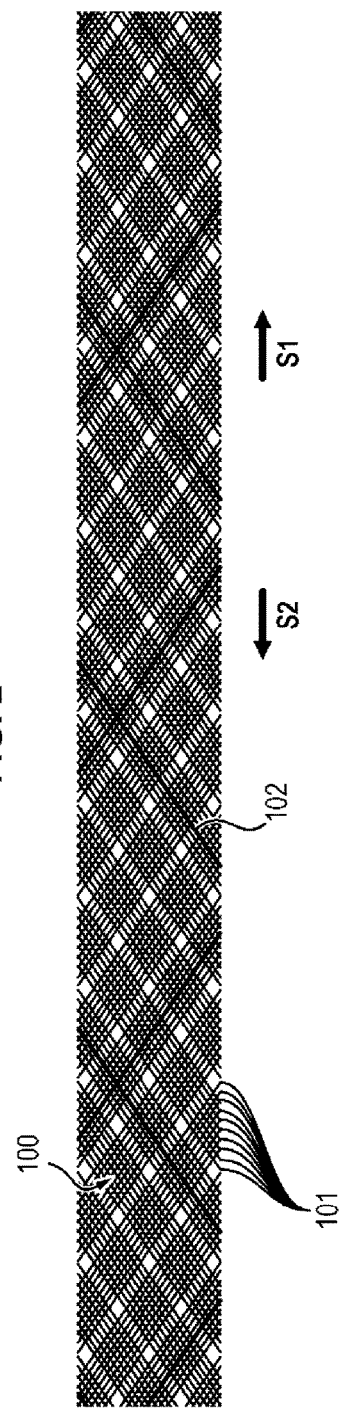
FIG. 2 is an illustration of a braiding pattern for the protective sheath according to a first embodiment of the invention.

FIGS. 2, 3, and 4 show different patterns of braided sheathes having a smaller and smaller detection surface, and therefore ever-increasing prediction performance.

The patterns illustrated in FIGS. 2, 3 and 4 correspond to braided sheathes comprising 32 braided spindles between them, specifically 16 spindles turning in a first direction S1 of rotation, and 16 spindles turning in a second direction S2 of rotation, opposite to S1. In the figures, the 16 first spindles which turn in the direction S1 turn to the right relative to the baseline of the figures, and the 16 other spindles which turn in the direction S2 turn to the left relative to the baseline of the figures.

In FIGS. 2, 3, and 4, each spindle 100 comprises 8 braiding strands 101.

The braided sheath whereof the pattern is shown in FIG. 2 comprises 8 detection strands 102, each replacing a braiding strand 101 of a specific spindle 100. The distribution is 4 detection strands in spindles which turn to the right and 4 detection strands in spindles which turn to the left, with one detection strand 102 maximum per spindle 100. As is preferred, as illustrated in FIG. 2, a detection strand 102 is integrated into every four spindles 100 in a direction of rotation, which ensures symmetry and equilibrium of the braided sheath.

The braided sheath whereof the pattern is shown in FIG. 3 comprises 16 detection strands 102 each replacing a braiding strand 101 of a specific spindle 100. The distribution is 8 detection strands in spindles which turn to the right and 8 detection strands in spindles which turn to the left, with one detection strand 102 maximum per spindle 100. As is preferred, as illustrated in FIG. 3, a detection strand 102 is integrated every second spindle 100 in a direction of rotation, which ensures symmetry and equilibrium of the braided sheath.

The braided sheath whereof the pattern is shown in FIG. 4 comprises 32 detection strands 102 each replacing a braiding strand 101 of a specific spindle 100. The distribution is 16 detection strands in spindles which turn to the right and 16 detection strands in spindles which turn to the left, with one detection strand 102 maximum per spindle 100. This arrangement is totally symmetrical and ensures equilibrium of the braided sheath.

A non-limiting example of use of the proposed prediction device relates to detection of fault without location. This can be the case for harness placed on the landing gear strut where harnesses are not repaired but changed in case of deterioration. In this case, measurement of resistance on the detection strands is enough. The detection strands are connected to the protective electromagnetic sheath at one end, and to a system for measuring resistance at the other end. The measured resistance depends on the number of detection strands, the length of the detection strand, its cross-section, its resistivity, the quality of the connection. The resistance can vary upwards in the event of rupture of a detection strand in an open circuit and downwards in the event of rupture of a detection strand in short-circuit.

Another non-limiting example of use of the proposed prediction device relates to fault detection with location. This can be the case for reparable harnesses difficult to access. Use of the location immediately disassembles the panel behind which the fault is located. In this case, the detection strands do not need to be connected to the braided sheath at the end of the harness, and the degradation monitoring of the detection strands is done by a reflectometry process. Such monitoring is preferably done by reflectometry only on a limited number of detection strands simultaneously so as to avoid reflection phenomena due to the parallel connection of the detection strands.

As is evident from the above, the proposed prediction device is particularly advantageous in its use. It also has the advantage of being produced very simply, by only slightly modifying the existing manufacturing method for the protective sheath. In particular, it is enough to adapt the coiling stage during which the braiding strands are generally gathered to form the braiding web constituting the spindle, which is then coiled. In fact, in this coiling step it suffices to replace one of the braiding strands by a detection strand, and form the braiding web.

The different braiding webs, integrating detection strands or not, are then uncoiled during a braiding step to form the protective sheath around the harness to be protected.

The reader will understand that many modifications can be made without departing materially from the novel ideas and advantages described here. Consequently, all the modifications of this type are intended to be incorporated within the scope of the protective sheath as presented, its manufacturing method and its use.

BIBLIOGRAPHIC REFERENCE

U.S. Pat. No. 6,265,880

The invention claimed is:

1. A device for prediction of faults in a harness formed by a plurality of cables joined together, in particular electrical cables, comprising a protective sheath intended to enclose the harness, the sheath comprising a plurality of braiding elements, said braiding elements being braided together to form a tubular sheath, each braiding element comprising a plurality of longitudinal braiding strands arranged to form a web, wherein the sheath comprises at least one electrically conductive detection strand, said detection strand being arranged with the braiding strands of a braiding element to be integrated into the web forming said braiding element, the detection strand being electrically insulated from the braiding strands of said braiding element.

2. The device of claim 1, wherein the sheath comprises a plurality of detection strands, the detection strands being electrically insulated from each other.

3. The device of claim 2, wherein the detection strands are integrated into different braiding elements forming the sheath.

4. The device of claim 2, wherein several detection strands of the plurality of the detection strands are integrated in braiding elements braided in a first direction of rotation, and the other detection strands of the plurality of detection strands are integrated into braiding elements braided in a second direction of rotation opposite the first direction of rotation.

5. The device of claim 2, wherein all the detection strands of the plurality of detection strands are integrated into braiding elements of the sheath braided in the same direction of rotation.

6. The device of claim 1, wherein the sheath comprises as many detection strands as braiding elements.

7. The device of claim 1, wherein each detection strand is an electrically conductive wire enclosed by an electrically insulating tubular element.

8. The device of claim 1, wherein the braiding strands of the braiding elements of the sheath are electrically conductive wires, the different braiding elements being braided to form a protective electromagnetic sheath of the cables.

9. The device of claim 1, wherein the braiding strands of the braiding elements of the sheath are textile yarns, the different braiding elements being braided to form a mechanical protective sheath of the cables.

10. A manufacturing method of a device for prediction of faults in a harness formed by a plurality of cables joined together, comprising a coiling step during which at least one detection strand is arranged with a plurality of braiding strands to form a braiding web which is coiled, said braiding web then being uncoiled during a braiding step to form a protective sheath around said harness, wherein the protective sheath comprises a plurality of braiding elements, said braiding elements being braided together to form a tubular sheath, each braiding element comprising the plurality of longitudinal braiding strands, the protective sheath including at least one electrically conductive detection strand, said detection strand being arranged with the braiding strands of one of said braiding elements, the detection strand being electrically insulated from the braiding strands of said one braiding element.

11. A prediction method of deterioration of a plurality of cables, in particular of electrical cables, combined to form a harness and enclosed by a device for prediction of faults in the harness, said prediction device including a protective sheath including a plurality of braiding elements, said braiding elements being braided together to form a tubular sheath, each braiding element comprising a plurality of longitudinal braiding strands, wherein the protective sheath includes at least one electrically conductive detection strand, said detection strand being arranged with the braiding strands of one of said braiding elements, the detection strand being electrically insulated from the braiding strands of said one braiding element, said method comprising applying an electric current in the at least one detection strand of the protective sheath, and monitoring of the electrical performance of said detection strand.

* * * * *